May 5, 1970 YOSHIHIRO OKUNO 3,510,580

GAIN CONTROLLED TRANSISTOR AMPLIFIER WITH CONSTANT BANDWIDTH OPERATION OVER THE AGC CONTROL RANGE

Filed March 5, 1968

INVENTOR
YOSHIHIRO OKUNO
BY

ATTORNEY

United States Patent Office

3,510,580

Patented May 5, 1970

3,510,580

GAIN CONTROLLED TRANSISTOR AMPLIFIER WITH CONSTANT BANDWIDTH OPERATION OVER THE AGC CONTROL RANGE

Yoshihiro Okuno, Soshigaya, Japan, assignor to RCA Corporation, a corporation of Delaware Filed Mar. 5, 1968, Ser. No. 710,476

Int. Cl. H04n 5/52

U.S. Cl. 178—7.3 8 Claims

ABSTRACT OF THE DISCLOSURE

A transistor amplifier having a given bandwidth is biased and operated to exhibit gain changes due to a forward automatic gain control signal applied to its base. The amplifier output circuit includes a high Q series resonant circuit, magnetically coupled to a low Q parallel resonant circuit, the combination affording stable bandwidth operation over the forward AGC control range.

This invention relates to improved gain controlled circuitry for receivers, such as television receivers, and more particularly to an automatic gain control circuit using a forward AGC mode of operation.

Automatic gain control (AGC) circuits are widely utilized in many types of electrical signal translating systems. Such circuits serve to maintain the output signal level of a receiver constant in amplitude despite variations in input signal strength. In transistor amplifiers there are basically two different modes of automatic gain control operation referred to as forward and reverse modes. In a reverse mode AGC the amplifier current and gain are reduced as the applied input signal level increases. However, reverse AGC for transistor circuits has a disadvantage in that with large input signals the input and output D.C. currents of the controlled stage may become so small that signal distortion results.

In the forward AGC for transistor circuits, the transistor current is increased and the gain is decreased as the applied signal level increases. Consequently the signal handling capability of the stage becomes greater. However the reduced output impedance of the amplifier transistor for lower gain (higher current) operation, loads the tuned output circuit causing a change in the frequency bandpass characteristic.

It is an object of the present invention to provide an improved forward gain controlled transistor amplifier circuit having a stable frequency response.

According to one embodiment of the present invention a transistor amplifier to be controlled by a forward going AGC voltage, has an output circuit including a high Q series resonant circuit coupled to a lower Q parallel resonant circuit. The series resonant circuit is driven by the transistor, and its Q increases as the output resistance of the transistor decreases. The bandpass characteristic of the amplifier is determined primarily by the lower Q parallel resonant circuit, and is not materially affected by changes in Q of the series resonant circuit. In addition, the amplifier gain is an inverse function of the Q of the series resonant circuit so that the AGC action is enhanced.

Figure 1:
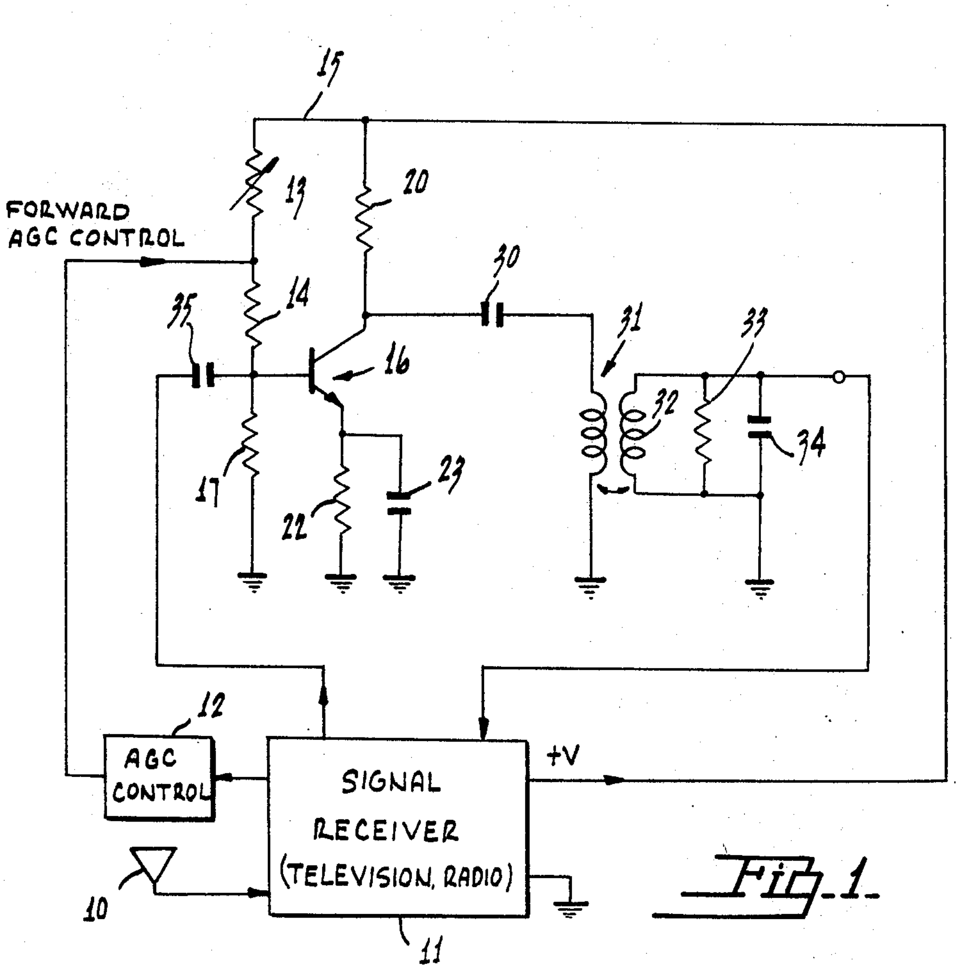
FIG. 1 is a schematic diagram, partially in block form, showing a receiver utilizing this invention.

Referring to FIG. 1, an antenna 10 is coupled to an appropriate input terminal of a receiver 11, which may, for example, be a television receiver. The receiver includes an AGC circuit 12 for developing a voltage whose amplitude varies as a function of the received signal amplitude. In addition the receiver includes an amplifier including a transistor 16 whose gain is to be controlled by the AGC voltage. By way of example, the amplifier may comprise the radio frequency, intermediate frequency, chroma, or other amplifier of a television or other type of signal receiver.

The AGC circuit 12 is coupled to the junction of two resistors 13 and 14 which are coupled between a common potential bus 15 and the base electrode of a transistor 16. These resistors 13 and 14 serve to maintain a suitable bias at the base electrode of the transistor 16. The base bias is also determined by the magnitude of a resistor 17 coupled between the base electrode of transistor 16 and ground. The above biasing arrangement serves to operate transistor 16 in a portion of its characteristic so that increases in the AGC voltage in the positive direction reduce the gain of the stage.

The collector electrode of transistor 16 is coupled to the potential bus 15 through a load resistor 20. In turn, the emitter electrode of transistor 16 is coupled to a point of reference potential through a resistor 22 which is bypassed by a capacitor 23. Resistor 22 serves as a self biasing resistor and would afford a reduction in gain of the transistor amplifier 16, hence acting as a degenerative impedance, if it were not bypassed by capacitor 23. Coupled to the collector electrode of transistor 16 is one terminal of a capacitor 30 whose opposite terminal is coupled to a point of reference potential, such as ground, through a coil or inductor 31. The combination of capacitor 30 and inductor 31 serves to function as a series resonant circuit having a relatively high Q. Inductively coupled to coil 31 is a parallel resonant output circuit comprising inductor 32, resistor 33 and capacitor 34. The combination having a first common terminal coupled to a point of reference potential, such as ground, and a second output terminal coupled back to the receiver 11 to be used therein by appropriate signal processing circuitry. The signal input path to the amplifier stage is from the receiver 11 through a coupling capacitor 35 to the base electrode of transistor 16. Potential is applied to the potential bus 15 by means of a suitable power supply contained within receiver 11 and labeled as +V. A point of reference potential, as ground, is common, both to the signal receiver 11 and to the above described circuit.

The circuit operates as follows. A signal to be amplified, which may, for example, be a chroma signal or an intermediate or radio frequency signal from the receiver 11, is applied to the base of transistor 16 by means of the coupling capacitor 35. This gain of the amplifier is controlled by the AGC control circuit 12 which provides at its output a voltage of a magnitude to maintain the output signal from the amplifier substantially constant. In the case of the NPN transistor 16 this voltage would increase in the positive direction with increasing signal strength. As the AGC voltage becomes more positive, more base current flows in transistor 16, causing the transistor 16 to draw more collector current. Due to the quiescent biasing of transistor 16 the increase in collector current causes the gain of the transistor 16 to decrease. But the decrease in gain of transistor 16 due to the increase in bias current causes the resistive component of the transistor 16 output impedance to decrease, while the output capacitance of the transistor 16 increases. These factors change the tuning and loading of the output circuit connected to the collector electrode of the transistor in prior art amplifier circuits. However, an output circuit including a high Q series resonant circuit coupled to a lower Q parallel resonant circuit, as shown in FIG. 1, minimizes the capacitive change and loading effects and a substantially constant bandwidth is maintained.

Figure 2:
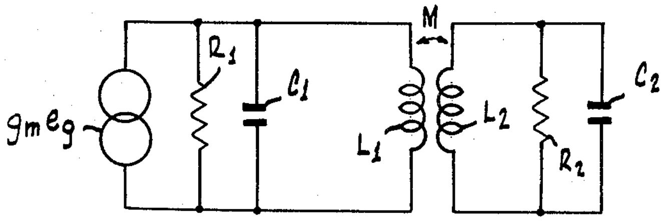
FIG. 2 is a schematic diagram of a conventional parallel double tuned circuit useful in describing this invention.

FIG. 2 shows the equivalent circuit of a conventional transistor amplifier coupled to and driving a conventional doubly tuned parallel resonant circuits. The current source of the transistor is represented by $g_m e_g$ where $g_m$ is the transconductance of the transistor and $e_g$ is the input voltage to the device. In this circuit if $Q_1$ of the first resonant circuit comprising $R_1$, $C_1$ and $L_1$ is much greater than $Q_2$ of the parallel output circuit of $L_2$, $R_2$ and $C_2$ then:

$$Q_1 \geq bQ_2 \quad (1)$$

where $$Q_1 = W_0 C_1 R_1 = R_1 / W_0 L_1 \quad (2)$$

$$Q_2 = W_0 C_2 R_2 = R_2 / W_0 L_2 \quad (3)$$

where $W_0$=center angular frequency (radians/sec.) and is the center angular frequency of the bandpass of the amplifier, where:

$$W_0 = 2\pi f_0$$

$f_0$=center frequency of bandpass characteristics.
$b$ is determined by the permissible degree of bandwidth characteristic change.
$R_1$=parallel resistance of the equivalent coil loss and the transistor output resistance ($R_0$) (ohms). If coil loss is negligible than $R_1=R_0$.
$R_2$=output load resistance (ohms) (assumed constant).
$C_1$=sum of the transistor output capacitance ($C_0$) and shunt or additional stray or added capacitance ($C_{ad}$). $C_{ad}$ can be selected to be larger than $C_0$ for FIG. 2 and hence will mask any change in the total varying output capacitance.
$C_2$=capacitance across secondary or load circuit capacitance.

For the above conditions, where $R_1=R_0$, and $C_1=C_{ad}$ the voltage gain, $G_v$, at the center frequency $f_0$ is $$G_v = \frac{g_m}{2\pi f_0 \sqrt{C_1 C_2} \cdot K} \quad (4)$$

where $$K = \frac{M}{\sqrt{L_1 L_2}} = \text{coefficient of coupling}$$

M=mutual inductance between $L_1$ and $L_2$.

In view of the above one must also note that the magnitude of the transistor output resistance $R_0$, in general, decreases with increasing collector current. Simultaneously the magnitude of the transistor's output capacitance, $C_0$, increases with increasing collector current and decreasing collector-to-base voltage.

In a transistor amplifier using reverse AGC it is quite easy to satisfy Equation 1 because the output resistance $R_0$ is initially relatively high and it increases as the bias current is reduced during reverse AGC and therefore as the gain of the transistor is reduced. But if a transistor operating in the circuit shown in FIG. 2 were used in a forward AGC mode, $R_0$ would become extremely low due to the increased collector current as the gain is reduced. The transistor output capacitance $C_0$ would also change substantially because of the consequential current increase and voltage reduction.

Figure 3:
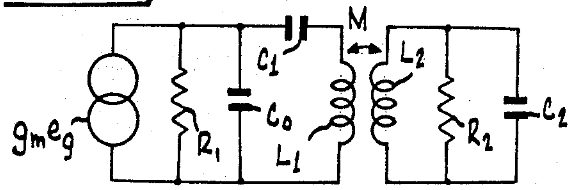
FIG. 3 is a schematic of the equivalent circuit of a transistor series tuned amplifier operating in accordance with this invention.

In order to achieve stable bandwidth operation with forward AGC reference is made to the equivalent circuit of the transistor amplifier of FIG. 1 as shown in FIG. 3. Here the parallel resonant primary of FIG. 2 has been replaced with a series resonant primary. The voltage gain ($G_v$) associated with the circuit of FIG. 3 is:

$$G_v = \frac{g_m}{2\pi f_0 \sqrt{C_1 C_2} K} \cdot \frac{1}{Q_1} \quad (5)$$

where $$Q_1 = 1/2\pi f_0 C_1 R_1 \quad (6)$$
$$1/W_0 C_0 >> R_1$$

In order to facilitate equation comparison like references are applied to the components in FIG. 3 as used in FIG. 2 and discrepancies in magnitude or relationship will be pointed out. Equation 5 then has the added factor of $1/Q_1$ affecting the gain as compared to the gain $G_v$ derived in Equation 4 for the circuit of FIG. 2.

In order to satisfy Equation 1 and hence maintain a stable bandpass characteristic the Q of the series resonant circuit must be maintained larger than that of the parallel resonant circuit. If $R_0$, the transistor output resistance is very large compared with the added external resistance $R_{ad}$ then:

$$R_1 = R_{ad}$$

where $R_{ad}$=additional resistance of the circuit which is in parallel with the output resistance ($R_0$) of the transistor and $$R_1 = \frac{R_0 R_{ad}}{R_0 + R_{ad}}$$

By substitution using Equations 1 and 6:

$$R_{ad} = \frac{1}{2\pi f_0 C_1 b Q_2} = \frac{1}{2\pi f_0 C_1 Q_1} \quad (7)$$

Since $R_1$ for the forward AGC mode of a transistor is decreasing with increasing current in the transistor and since $Q_1$ is determined by $R_1$, this assures that the series resonant circuit of FIG. 3 exhibits an increasing $Q_1$ with a decreasing $R_1$. This tends to maintain the overall bandpass constant, and primarily determined by $Q_2$. Hence there is a small bandshape change with the application of forward AGC in spite of a resistance change in the series primary circuit. Due to the use of the series tuned primary circuit the value of $C_1$ is chosen to be small in FIG. 3 and hence one need not worry about variations of $C_0$ as the equivalent capacity is equal to the series combination of $C_1$ and $C_0$, which is primarily $C_1$ if it is selected small as indicated above. Furthermore if $C_1$ is small the gain reduction of $1/Q_1$ of the series resonant circuit of FIG. 3 over the parallel resonant circuit of FIG. 2 becomes negligible as we are no longer concerned with the variations of $C_0$ serving to detune or load the circuit.

If one now compares Equation 4 with Equation 5 it can be seen that the gain $G_v$ of the circuit of FIG. 3 (Equation 5) will change by a factor of $g_m/Q_1$ while the gain in Equation 4 varies only with the change of $g_m$. In the region selected to afford optimum forward AGC control for the transistor shown in FIG. 1, $g_m$ and $R_0$ both decrease with increasing bias current and hence $Q_1$ will increase thereby enhancing the gain change as compared to that obtainable from a reverse AGC operated parallel tuned circuit as in FIG. 2. As mentioned previously the transistor's output capacitor $C_0$ for the forward AGC mode is effectively "swamped" out by the resistance $R_0$ and hence does not serve to mistune the low impedance series resonant circuit to any extent.

A chroma amplifier using forward AGC (usually referred to as automatic chroma control) has been built according to FIG. 1 and used the following components.

Transistor 16—TA2605
Resistor 13—30,000 ohms
Resistor 14—1,000 ohms
Resistor 17—4,700 ohms
Resistor 22—680 ohms
Resistor 20—1,200 ohms
Resistor 33—560 ohms
Capacitor 35—0.1 microfarad
Capacitor 23—0.1 microfarad
Capacitor 30—6 micromicrofarads
Capacitor 34—250 micromicrofarads
Inductors 31 and 32—$Q_0$=65 at 3.58 mHz.

The circuit, as above, had a bandwidth of approximately 1.2 mHz. and a center frequency of about 3.58 mHz. Transistor 16 was a planar transistor and not one specially fabricated for forward AGC use. The circuit exhibited a gain variation of about 100 db with a maximum input voltage of about 100 millivolts peak to peak.

What is claimed is:

1. In a gain controlled amplifier of the type including an active device having input and output electrodes;

means providing a source of a signal to be amplified coupled between said input and common electrodes; and means providing a gain controlling voltage coupled between said input and common electrodes for reducing the gain of said amplifier by increasing the current between said output and common electrodes, the improvement of an output circuit for said amplifier including a high Q series resonant circuit tuned to the frequency of the signals to be amplified, means coupling said series resonant circuit between said output and common electrodes, a parallel resonant circuit having a Q which is lower than that of said series resonant circuit coupled to said series resonant circuit.

2. The gain controlled amplifier as defined in claim 1 wherein said series resonant circuit and said parallel resonant circuit include respective mutually coupled inductors.

3. In a transistor amplifier having an input and output terminal, said input terminal coupled to an automatic gain control circuit for varying said transistor amplifier's gain in a forward mode over a desired range, the improvement therewith comprising:

(a) a series resonant circuit having a specified relatively high quality factor coupled between said transistor amplifier output terminal and a point of reference potential, (b) a parallel resonant circuit having a lower quality factor than said specified factor mutually coupled to said series resonant circuit for maintaining said amplifiers bandpass substantially constant over said desired range.

4. The circuit according to claim 3 wherein said series resonant circuit is a capacitor in series with a first inductor and said parallel resonant circuit is a second inductor magnetically coupled to said first inductor, said second inductor in shunt with a resistor and a capacitor.

5. In a television receiver having an automatic gain control circuit capable of providing an increasing voltage with a decrease in signal strength as received by said receiver, a selective amplifier for use therein in combination comprising:

(a) a transistor having a base, collector and emitter electrode, (b) a series resonant circuit having a specified relatively high quality factor coupled between said transistor's collector electrode and a point of reference potential, (c) a parallel resonant circuit having a lower quality factor than said specified factor mutually coupled to said series resonant circuit, (d) means coupled to said transistor electrodes for biasing said transistor in a region of its characteristics suitable for gain control, (e) means coupled to said transistor base electrode responsive to said increasing voltage from said automatic gain control circuit to increase the gain of said transistor.

6. A selective amplifier comprising:

(a) a transistor having a base, collector and emitter electrode, said transistor being capable of gain variation by controlling the base current thereto in a forward mode, comprising:

(b) a series resonant circuit coupled between said collector electrode and a point of reference potential said series resonant circuit having a specified quality factor $Q_1$, (c) a parallel resonant circuit magnetically coupled to said series resonant circuit and having a quality factor, $Q_2$ where $Q_1$ is greater than $Q_2$ by a factor of three or more times, (d) means coupled to said transistor base electrode for varying said transistor gain in said forward mode.

7. In a transistor amplifier circuit having an output terminal, said amplifier having a gain control capability by biasing and operating said amplifier in a forward mode, which mode causes said tarnsistor output impedance to be substantially low and to undesirably decrease with decreasing gain, the improvement therewith comprising:

(a) a series resonant circuit coupled between said transistor amplifier output terminal and a point of reference potential, (b) a parallel resonant output circuit magnetically coupled to said series resonant circuit for maintaining a specified bandpass characteristic independent of said decrease in said transistor output impedance.

8. A gain control circuit comprising:

(a) a transistor having a base, collector and emitter electrode, said transistor capable of exhibiting a varying gain in accordance with a change in base current, (b) a series resonant circuit coupled between said collector electrode and a point of reference potential, (c) means coupled to said transistor base for varying said base current and therefore said transistor gain, (d) a parallel resonant output circuit magnetically coupled to said series resonant circuit for determining a specified bandwidth characteristic at its output substantially independent of said transistors' gain variation.

References Cited

UNITED STATES PATENTS

| | | | |
|---|---|---|---|
| 3,258,712 | 6/1966 | Foster et al. | 330—166 |
| 3,461,394 | 8/1969 | Ulmer | 330—21 |

ROBERT L. GRIFFIN, Primary Examiner

R. L. RICHARDSON, Assistant Examiner

U.S. Cl. X.R.

325—400; 178—5.8; 330—29, 31, 165, 195